US009196671B2

(12) United States Patent
Behrends et al.

(10) Patent No.: US 9,196,671 B2
(45) Date of Patent: Nov. 24, 2015

(54) INTEGRATED DECOUPLING CAPACITOR UTILIZING THROUGH-SILICON VIA

(71) Applicant: International Business Machines Corporation, Armonk, NY (US)

(72) Inventors: Derick G. Behrends, Rochester, MN (US); Todd A. Christensen, Rochester, MN (US); Travis R. Hebig, Rochester, MN (US); Michael Launsbach, Rochester, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/667,043

(22) Filed: Nov. 2, 2012

(65) Prior Publication Data

US 2014/0124943 A1    May 8, 2014

(51) Int. Cl.
| H01L 23/48 | (2006.01) |
| H01L 49/02 | (2006.01) |
| H01L 21/768 | (2006.01) |
| H01L 29/94 | (2006.01) |

(52) U.S. Cl.
CPC .......... *H01L 28/40* (2013.01); *H01L 21/76898* (2013.01); *H01L 23/481* (2013.01); *H01L 29/945* (2013.01); *H01L 2924/0002* (2013.01)

(58) Field of Classification Search
USPC .......... 257/698, 774, E23.011; 438/109, 129, 438/401
See application file for complete search history.

(56) References Cited

U.S. PATENT DOCUMENTS

| 5,426,072 | A  | * | 6/1995 | Finnila .......................... 438/107 |
| 6,611,024 | B2 | * | 8/2003 | Ang et al. ..................... 257/350 |
| 8,088,667 | B2 |   | 1/2012 | DeNatale et al. |
| 2010/0164062 | A1 | * | 7/2010 | Wang et al. ................... 257/532 |
| 2010/0308435 | A1 |   | 12/2010 | Nowak et al. |
| 2011/0108948 | A1 |   | 5/2011 | Kim et al. |
| 2012/0074515 | A1 |   | 3/2012 | Chen et al. |
| 2013/0099312 | A1 | * | 4/2013 | Dao et al. ....................... 257/335 |
| 2014/0127875 | A1 |   | 5/2014 | Behrends et al. |

OTHER PUBLICATIONS

Trivedi et al., "Impact of Through-Silicon-Via Capacitance on High Frequency Supply Noise in 3D-Stacks", Electrical Performance of Electronic Packaging and Systems (EPEPS), 2011 IEEE 20th Conference on., Published 2011, pp. 105-108. DOI: 10.1109/EPEPS.2011.6100199.

(Continued)

*Primary Examiner* — Marvin Payen
(74) *Attorney, Agent, or Firm* — Penny L. Lowry; Robert Williams

(57) ABSTRACT

A semiconductor device may include a through substrate via (TSV) conductive structure that may extend vertically through two or more layers of the semiconductor device. The TSV conductive structure may be coupled to a first voltage supply. The semiconductor device may include substrate layer. The substrate layer may include a first dopant region and a second dopant region. The first dopant region may be coupled to a second voltage supply. The second dopant region may be in electrical communication with the TSV conductive structure. The semiconductor device may include a first metal layer and a first insulator layer disposed between the substrate layer and the first metal layer. The first metal layer may laterally contact the TSV conductive structure. The first and second voltage supply may be adapted to create a capacitance at a junction between the first dopant region and the second dopant region.

8 Claims, 10 Drawing Sheets

(56) References Cited

OTHER PUBLICATIONS

Disclosed Anonymously, "Low-Cost On-Chip Passive Devices Formed by Through Silicon Vias", IP.Com Prior Art Database, IP.Com No. IPCOM000203775D, Electronic Publication Feb. 1, 2011.

Henderson et al, "Implementing Decoupling Devices Inside a TSV DRAM Stack", IBM Disclosure ROC920120071US1, U.S. Appl. No. 13/477,371, filed May 22, 2012.

\* cited by examiner

INTEGRATED DECOUPLING CAPACITOR UTILIZING THROUGH-SILICON VIA

FIELD

The present invention relates to semiconductor structures and more particularly, a decoupling capacitor utilizing through-silicon via.

BACKGROUND

Integrated circuits (ICs) have become ubiquitous. Cell phones, PDAs, cameras, medical devices, laptops, and many other devices include ICs. A typical IC includes several types of semiconductor devices, such as transistors. In modern ICs, transistors may be used to implement logic or memory functions. Typically, ICs have been planar in design. Planar semiconductor chip designs limit the amount of circuitry that may be placed on a single IC die.

To overcome some of the limitations of planar ICs, designers began stacking chips vertically to form three-dimensional designs. A three-dimensional (3D) IC, therefore, is a semiconductor assembly in which two or more planar layers of active electronic components are integrated both vertically and horizontally into a single device. These three-dimensional structures increase the density of active circuits.

SUMMARY

In one aspect of the invention, a semiconductor device is described. The semiconductor device may include a through silicon via (TSV) conductive structure that may extend vertically through two or more layers of the semiconductor device. The TSV conductive structure may be coupled to a first voltage supply. The semiconductor device may include substrate layer. The substrate layer may include a first dopant region and a second dopant region. The first dopant region may be coupled to a second voltage supply. The second dopant region may be in electrical communication with the TSV conductive structure. Also, the semiconductor device may include a first metal layer and a first insulator layer disposed between the substrate layer and the first metal layer. The first metal layer may laterally contact the TSV conductive structure. The first voltage supply and the second voltage supply may be adapted to create a capacitance at a junction between the first dopant region and the second dopant region.

In another aspect of the invention a method is described. The method may include fabricating a semiconductor device having a substrate layer including a first dopant region and a second dopant region, a first metal layer, and a first insulator layer disposed between the substrate layer and the first metal layer. The method may include vertically depositing a through substrate via (TSV) conductive structure through two or more layers of the semiconductor device. The second dopant region may be in electrical communication with the TSV conductive structure and the first metal layer may be laterally contacting the TSV conductive structure. The method may include coupling a first voltage supply to the TSV conductive structure and a second voltage supply to the first dopant region. The first and second voltage supplies are adapted to create a capacitance at a junction between the first and second dopant regions.

BRIEF DESCRIPTION OF THE DRAWINGS

The Detailed Description of aspects of the invention will be made with reference to the accompanying drawings, wherein like numeral designate corresponding parts in the figures.

DETAILED DESCRIPTION

Figure 1:
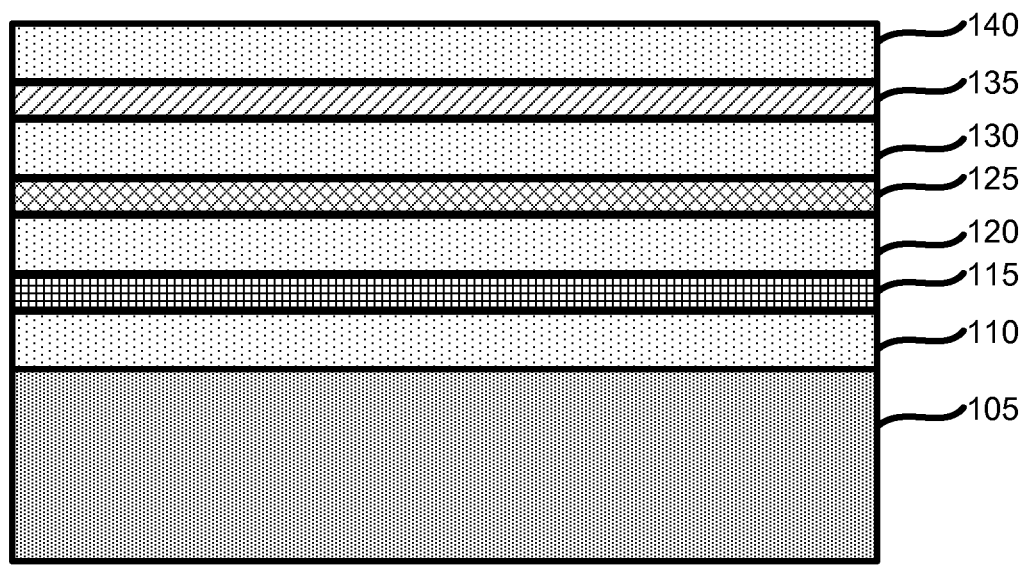
FIGS. 1-6 are sequential vertical cross-sectional views through various processing steps of a first exemplary semiconductor structure according to an aspect of the invention.

Some issues may arise in three-dimensional integrated circuits (3D IC). As the transistor size decreases, the voltage supplied to the transistors may also decrease. As the transistor density increases, the amount of switching activity per unit area may also increase. This results in an increase in the noise generated on the power supply rails. As power supply noise increases, the performance of both internal devices and off-chip drivers is adversely impacted due to the reduction of noise margins available for the system design.

For example, if a voltage level (e.g. Vdd-ground) for a device is fixed, changing power demands are manifested as changing current demand. The power supply must accommodate these variations in current draw with as little change as possible in the power supply voltage. If the current draw in a device changes, the power supply generally cannot respond to the change instantaneously. As a consequence, the voltage at the device changes for a brief period before a power supply has a chance to respond. In some instances, a voltage regulator may be used to regulate short-term power demands by adjusting the amount of current supplied to the device to keep the supply voltage constant. However, voltage regulators may only effectively maintain the supply voltage for events at lower frequencies. For transient events that occur at frequencies above limits of the voltage regulator, the voltage regulator may not detect and correct for noise due to the brevity in which the noise may occur. This noise may create problems in supply voltage for circuits that operate on high frequencies such as at the transistor level for logic.

To maintain stable supply voltages during the transient events, decoupling capacitors may be used in addition to voltage regulators. A decoupling capacitor serves as the local energy storage for the device. The capacitor uses its stored energy to respond very quickly to changing current demands to maintain stable supply voltages.

Deep trench capacitors may be used as decoupling capacitors in 3D ICs. However, as transistor sizes decrease and transistor densities increase due to demand for smaller ICs, finding area on the ICs for decoupling capacitors has become difficult. Conventional parallel plate capacitors may take up large portions of substrate area and yield relatively small values of capacitance for the area they consume. Alternatively, through silicon vias (TSVs), a feature of 3D ICs, may be used to provide decoupling capacitance. TSVs are vertical chip connections that pass through the IC die that may be used to connect a layer of ICs on one side of the substrate to an opposite side of the substrate or to intermediate layers. Typically, many of the TSVs are needed to provide power connections from a power source through the bottom of the chip to the top of the chip. TSVs occupy relatively small amounts of substrate area in comparison to many types of capacitors used in 3D ICs. TSVs may include a conducting core and an insulating sleeve contained in a semiconductor substrate. If the core is connected to a supply voltage and the substrate is connected to a ground, then a decoupling capacitor is formed between the core and the substrate.

However, TSVs with insulated material around the conducting core may result in higher resistance between the TSV and the metal layers to which the TSVs supply power. Because TSVs have an insulator around them to create a decoupling capacitor they do not directly make electrical connections with the metal stacks as they pass through them. Instead, TSVs make their connections to the metal layers by passing electrical connections through the metal stacks and connecting these to the top area of the TSVs. The higher resistance issues may occur in the lower metal stacks due to having to make electrical connections from the top of the stack to the bottom.

According to an aspect of the invention, a semiconductor device having a TSV is described that may result in reduced electrical grid resistance to all levels of metal in the 3D IC. Furthermore, there is an integrated decoupling capacitance between the TSV and the bulk silicon that does not require an insulator. A doped silicon diffusion may provide the isolation between the supply power of the TSV and the grounded bulk silicon. Using a doped silicon diffusion as the isolation may result in an inherent decoupling capacitance that is much higher than conventional silicon dioxide.

FIGS. 1-6 show sequential views of exemplary manufacturing stages of a TSV structure according to an aspect of the invention. FIG. 7 illustrates an additional manufacturing stage that may be taken for an additional aspect of the invention. Figures with the same numeric label correspond to the same stage of manufacturing. The figures are not drawn to scale. The dimensions may vary in some aspects. Also, the shapes of the figures may depict ideal shapes. Variations in actual manufacturing may result in structures deviating from the depicted figures.

Referring to FIG. 1, according to an aspect of the invention, a semiconductor structure 100 prior to creating a semiconductor device 600 (FIG. 6) with a TSV structure may be fabricated according to known techniques. FIG. 1 illustrates a vertical cross-section of the semiconductor structure 100. The semiconductor structure may be part of a 3D IC. The semiconductor structure 100 may include a substrate 105 layer forming the base of the semiconductor structure 100. On top of the substrate 105, the semiconductor structure 100 may include one or more metal layers and insulator layers. The substrate 105 and the metal layers may each be separated by the insulator layers. This aspect illustrates a bulk silicon process, but a silicon on insulator (SOI) process may be used in other aspects.

As illustrated in FIG. 1, the semiconductor structure 100 includes three metal layers but may include one or more metal layers. A first insulator layer 110 may be formed on the substrate 105. A first metal layer 115 may be formed on the first insulator layer 110. A second insulator layer 120 may be formed on the first metal layer 115. A second metal layer 125 may be formed on the second insulator layer 120. A third insulator layer 130 may be formed on the second metal layer 125. A third metal layer 135 may be formed on the third insulator layer 130. A fourth insulator layer 140 may be formed on the third metal layer 135. These layers may make up the semiconductor structure 100.

Certain materials may make up the substrate 105, insulator layers 110, 120, 130, and 140, and the metal layers 115, 125, and 135. The substrate 105 may be single crystal silicon. However, the substrate 105 may comprise other appropriate semiconducting materials, including, but not limited to, SiC, Ge alloys, GaP, InAs, InP, SiGe, GaAs, other III/V or II-VI compound semiconductors or other crystalline structures. The substrate 105 may be suitably doped to form a capacitive junction area, described further below in the process. For example, the substrate 105 may be doped with a first dopant such as P– type dopant. The substrate 105 may have a dopant concentrations typically in the range from about $10^{14}/cm^3$ to about $10^{17}/cm^3$, although other concentrations may be contemplated that produce a capacitance when in a depletion region between P– type and N+ type substrate. The insulator layers 110, 120, 130, and 140 may be any suitable insulator/dielectric such as SiO2 or HfO2. The metal layers 115, 125, and 135 may be conductors such as polysilicon suitably doped as a conductor. If metal layer is polysilicon, then the polysilicon may be silicided (e.g., titanium silicide) to enhance conductivity. However, it will be appreciated that various other materials may be substituted. Some non-limiting examples of these materials include: tungsten, titanium, tantalum, silicon nitride, silicides such as cobalt or nickel silicides, germanium, silicon germanium, other metals, and various combinations of the foregoing. Furthermore, a metal layer may be comprised of the same material as the other metal layers in the semiconductor structure 100 or each metal layer may be unique from the other metal layers or a combination of similar and unique metals.

Dimensions of the layers of the semiconductor structure may vary. The height of the substrate may be typically 100 μm or more before being reduced in the later process steps below. Each insulator layer and metal layer may vary in height. Typically, the shortest metal and insulator layers are near the substrate and may be as tall as 1 μm, but other heights may be contemplated. As the layers get further away from the substrate 105 and closer to the frontside, the taller the layers may become. They may reach heights of 10 μm or more.

Figure 2:
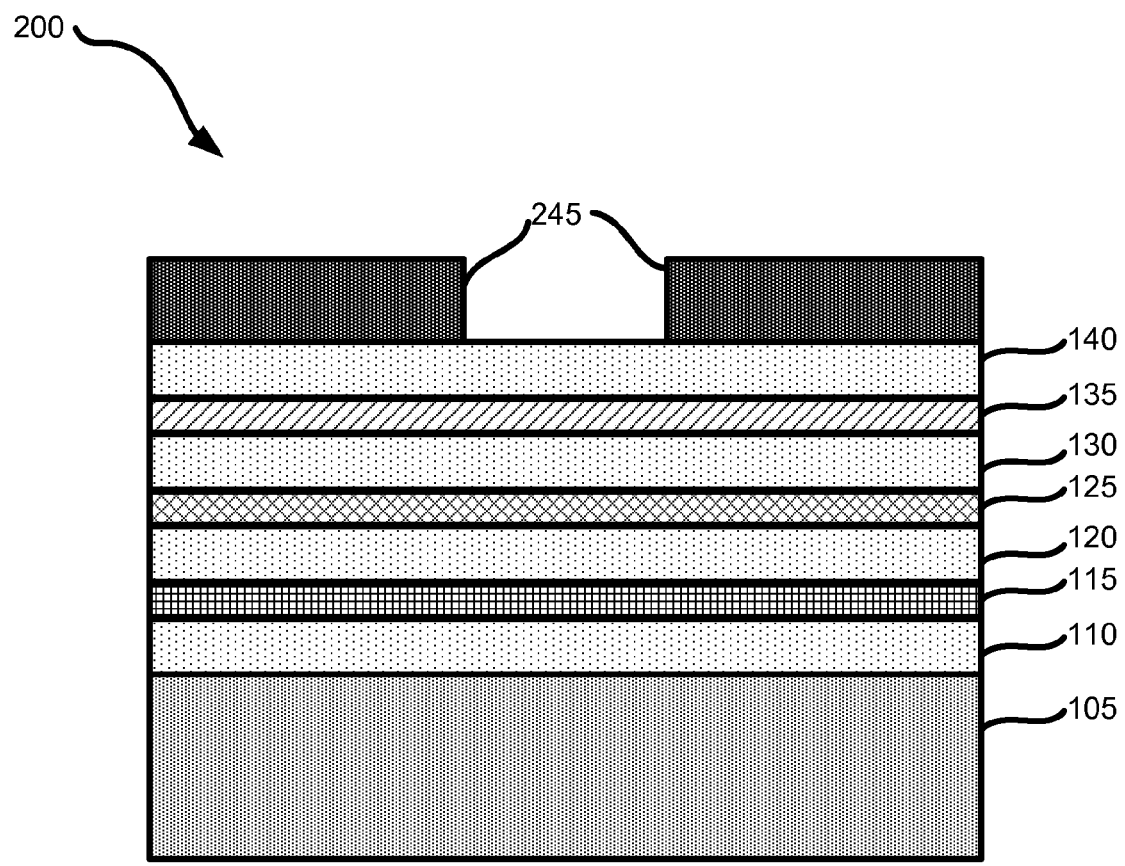

Referring to FIG. 2, according to an aspect of the invention, a photoresist layer 245 may be added to semiconductor structure 100 (FIG. 1), now designated by reference number 200. The photoresist layer 245 may be added on top of the insulator layer 140 or the semiconductor structure 200. The photoresist layer 245 may be patterned for where a TSV will be.

Figure 3:
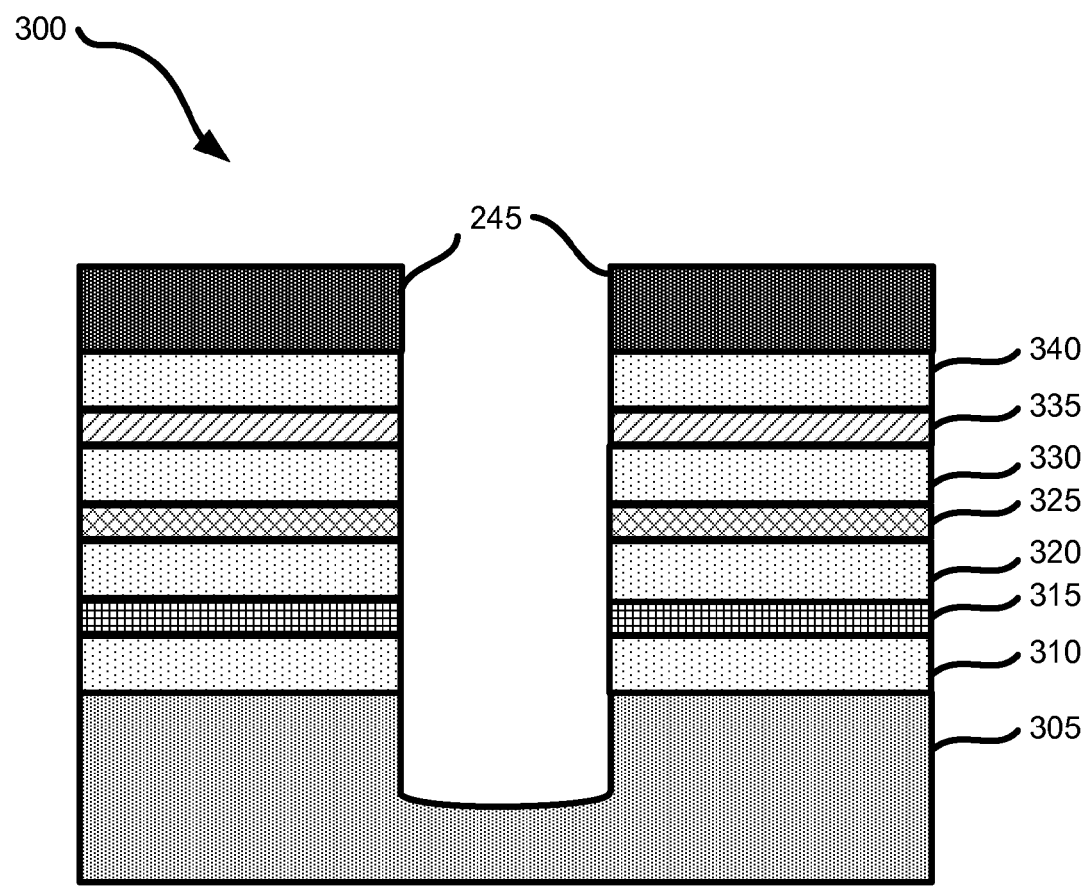

Referring to FIG. 3, according to an aspect of the invention, a TSV may be formed in the semiconductor structure 200 of FIG. 2, now designated by reference number 300. The TSV may be etched into the bulk silicon to a suitable depth. The TSV may be etched 20-55 μm deep in the substrate 305 in one aspect of the invention, however other depths may be considered. Also, the TSV may typically have a diameter of 20-30 μm, but again, other diameter dimensions may be considered. The structure 300 may include a substrate 305. In one embodiment, the structure 300 may also include insulator layers 310, 320, 330, and 340. Further, the structure 300 may also include metal layers 315, 325, and 335. Although not illustrated in the figures, the left and right metal and insulator layers may be contiguous, hence the same reference numbers. Since FIGS. 1-7 are vertical cross-sectional views, for simplicity, the contiguousness of the layers is not shown to better illustrate the etched opening. The opening as illustrated may be cylindrical in shape, however, in other aspects, other shapes may be considered.

Figure 4:
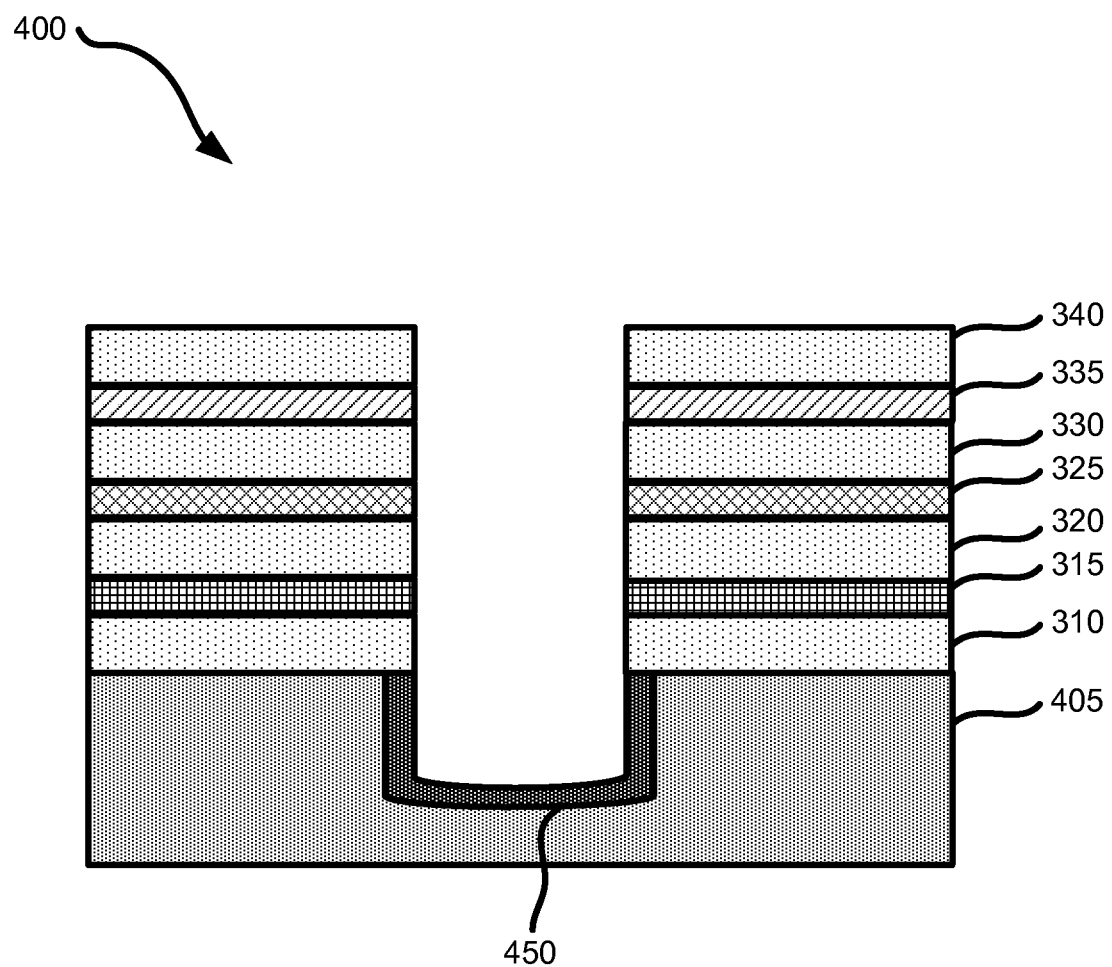

Referring to FIG. 4, according to an aspect of the invention, a non-directional diffusion may be performed on semiconductor structure 300 of FIG. 3, now designated by reference number 400. The non-directional diffusion may occur in the substrate 305 (FIG. 3) having a first dopant. After the substrate 305 is doped with a second dopant, the substrate 305 is referred to first dopant region 405 and second dopant region 450. The diffusion may be a POCL3 type of diffusion that implants N+ dopants forming a diffusion region referred to as second dopant region 450. The N+ dopant concentration of the second dopant region 450 may be in the range from about $10^{20}/cm^3$ to about $10^{22}/cm^3$. Also, in FIG. 4, the photoresist layer 345 may be removed.

Figure 10:
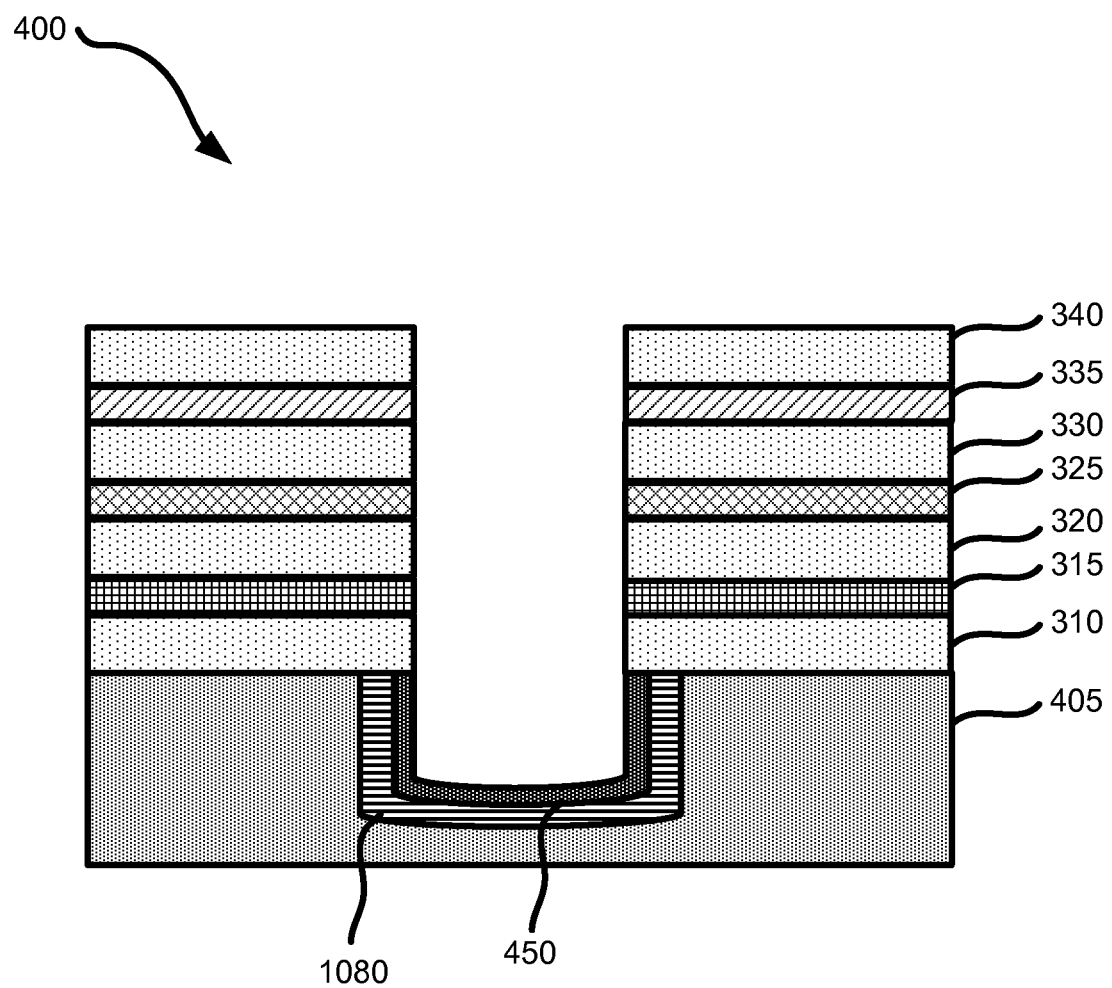
FIG. 10 is a vertical cross-sectional view of an alternative exemplary semiconductor structure having dual high-concentration dopant regions according to an aspect of the invention.

Referring to FIG. 10, the manufacturing step described for FIG. 4 may include an additional aspect of the invention. Prior to doping the substrate 305 with the second dopant, a separate non-directional diffusion may be performed on semiconductor structure 300 of FIG. 3 forming a third dopant region 1080. The diffusion may implant P+ dopants forming a higher concentration of P material in the third dopant region 1080. The concentration may be in the range from about $10^{20}/cm^3$ to about $10^{22}/cm^3$, however, other concentrations may be contemplated. The second dopant region 450 may then be formed with N+ dopant. The N+ dopant concentration of the second dopant region 450 may be in the range from about $10^{20}/cm^3$ to about $10^{22}/cm^3$, however, other concentrations may be contemplated. The higher dopant concentration of the third dopant region 1080 and the second dopant region 450 may increase the capacitance at the junction separating the third and second dopant region 1080, 450 by decreasing the width of the depletion region.

Figure 5:
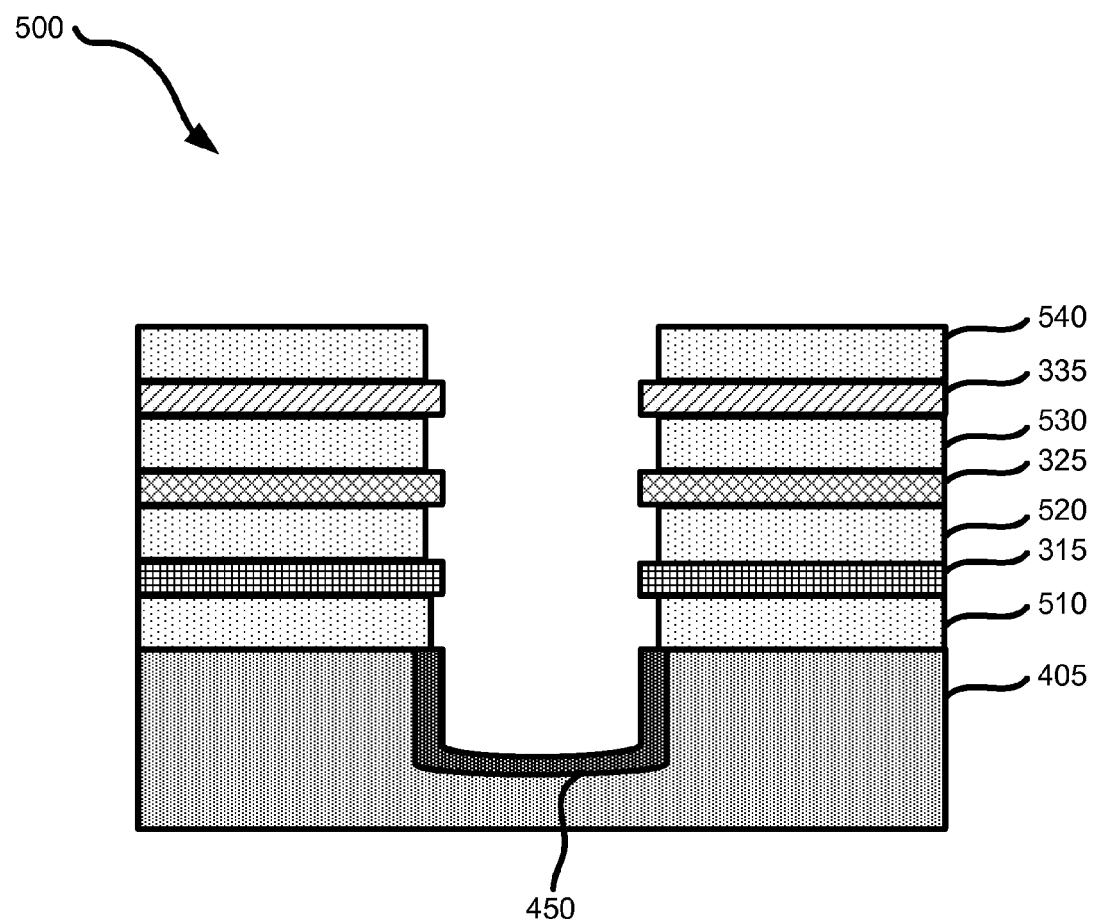

Referring to FIG. 5, according to an aspect of the invention, an optional step may be performed to expose the edges of the metal layers 315, 325, and 335 of semiconductor structure 400 of FIG. 4, now designated reference number 500. FIG. 5 illustrates the semiconductor structure 500 after an isotropic selective oxide etch that may expose more of the ends of the metal layers 315, 325, and 335 to allow better connectivity to a subsequent TSV structure 655 formed in FIG. 6. The isotropic selective oxide etch may remove a portion the exposed insulator layers 310, 320, 330, and 340, now designated by reference numbers 510, 520, 530, and 540, respectively.

Figure 6:
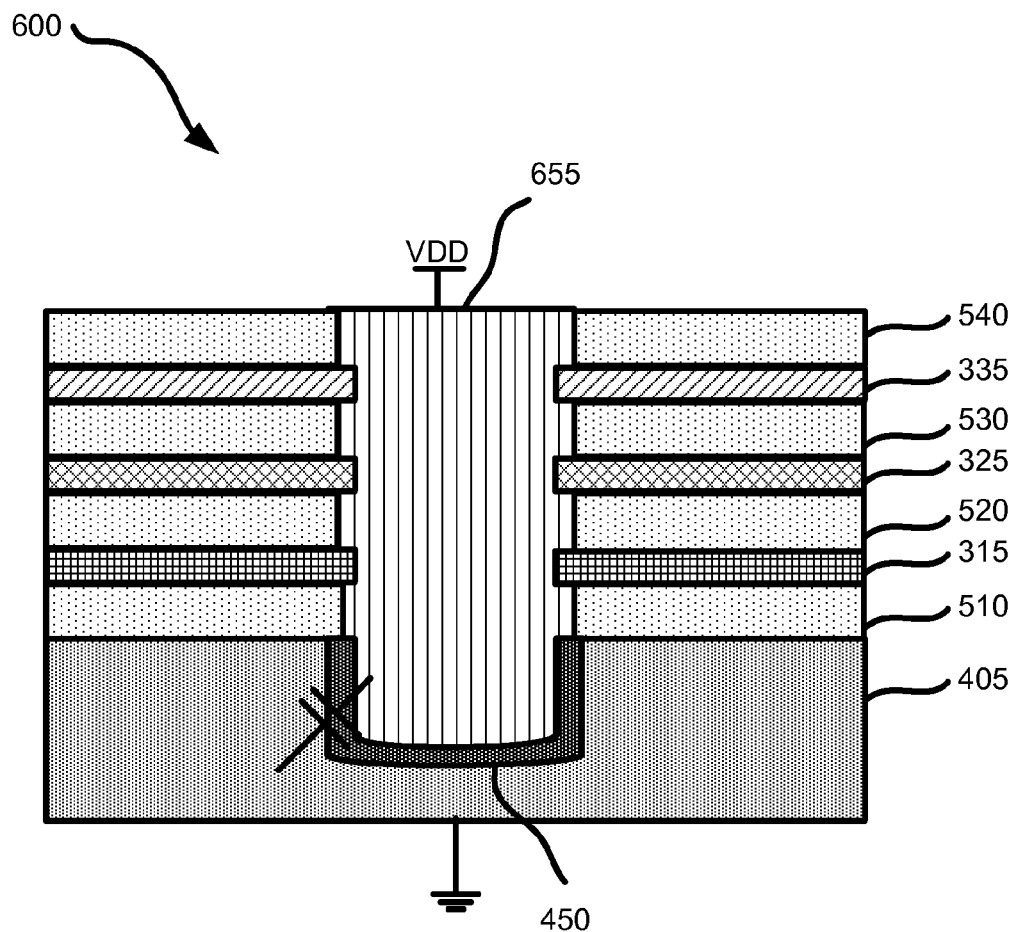
Figure 7:
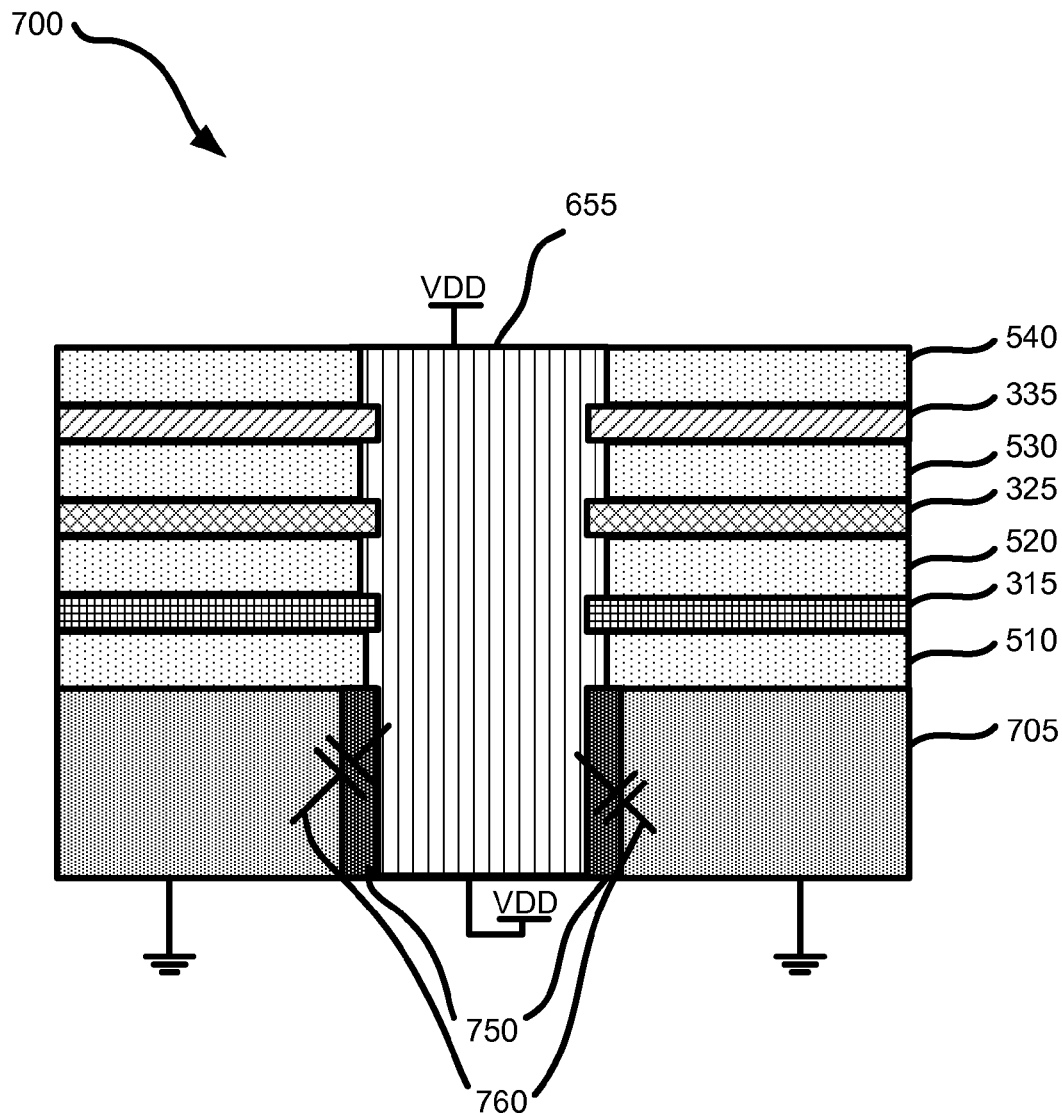
FIG. 7 is a vertical cross-sectional view of a second exemplary semiconductor structure according to an aspect of the invention.

Referring to FIG. 6, according to an aspect of the invention, a TSV structure 655 may be formed in the opening of semiconductor structure 500 of FIG. 5 forming semiconductor device 600. The TSV structure 655 may be copper but may be any suitable conductive material such as, but not limited to: Ti, W, Ta, or Al. Also the TSV structure 655 may also include a metal compound liner such as TaN, CuN, TiN, and WN to improve adhesion or other structural and electrical properties of the TSV structure 655. The TSV structure 655, after being deposited, may be polished flat at the frontside or top of the semiconductor device 600. The first dopant region 405 may be coupled to a second voltage supply such as ground or other suitable voltage. The TSV structure 655 may be coupled to a first voltage supply such as Vdd. In one embodiment, Vdd may any suitable power supply, such as a primary power supply. The process may stop at this point. The semiconductor 600 may benefit from lower resistance power connections due to the direct power connections between the TSV structure 655 and the metal layers 315, 325, and 335. Also, integrated decoupling capacitance may be achieved after the TSV structure 655 is connected to the first voltage supply and the substrate 405 is connected to the second voltage supply. The capacitance may form at the depletion region at the junction between the first dopant region 405 and the second dopant region 450 creating the isolation needed for a decoupling capacitance. The capacitance may be around 3 pF but other capacitances for case specific needs may be contemplated by varying dopant concentrations, TSV structure 655 dimensions, and Vdd. The semiconductor device 600 may be used for a chip that is not part of a 3D IC implementation.

Referring to FIG. 7, according to an aspect of the invention, the backside or bottom of the TSV structure 655 may be exposed to the semiconductor device 600 of FIG. 6, now designated reference number 700. To expose the TSV structure 655, the substrate of the backside of the semiconductor device 700 may be thinned, which may remove part of the first dopant region 405 and the second dopant region 450 of FIG. 6 exposing the bottom of TSV structure 655 forming first dopant region 705 and second dopant region 750. The thinning may be done before making standard backside and frontside connections and completing the 3D IC connections. The first voltage supply (Vdd) may be attached to the frontside and backside of the TSV structure 655. Furthermore, the second voltage supply (ground) may be coupled to the first dopant substrate 705. The first and second voltage supplies may create the decoupling capacitance 760 between the first dopant substrate 705 and the second dopant substrate 750. The decoupling capacitance 760 may be 3 pF per TSV structure 655. Furthermore, the structure of this embodiment creates a very low resistance between the first voltage supply and the metal layers 315, 325, and 335 where the metal layers have direct electrical connections with the TSV structure 655.

Figure 8:
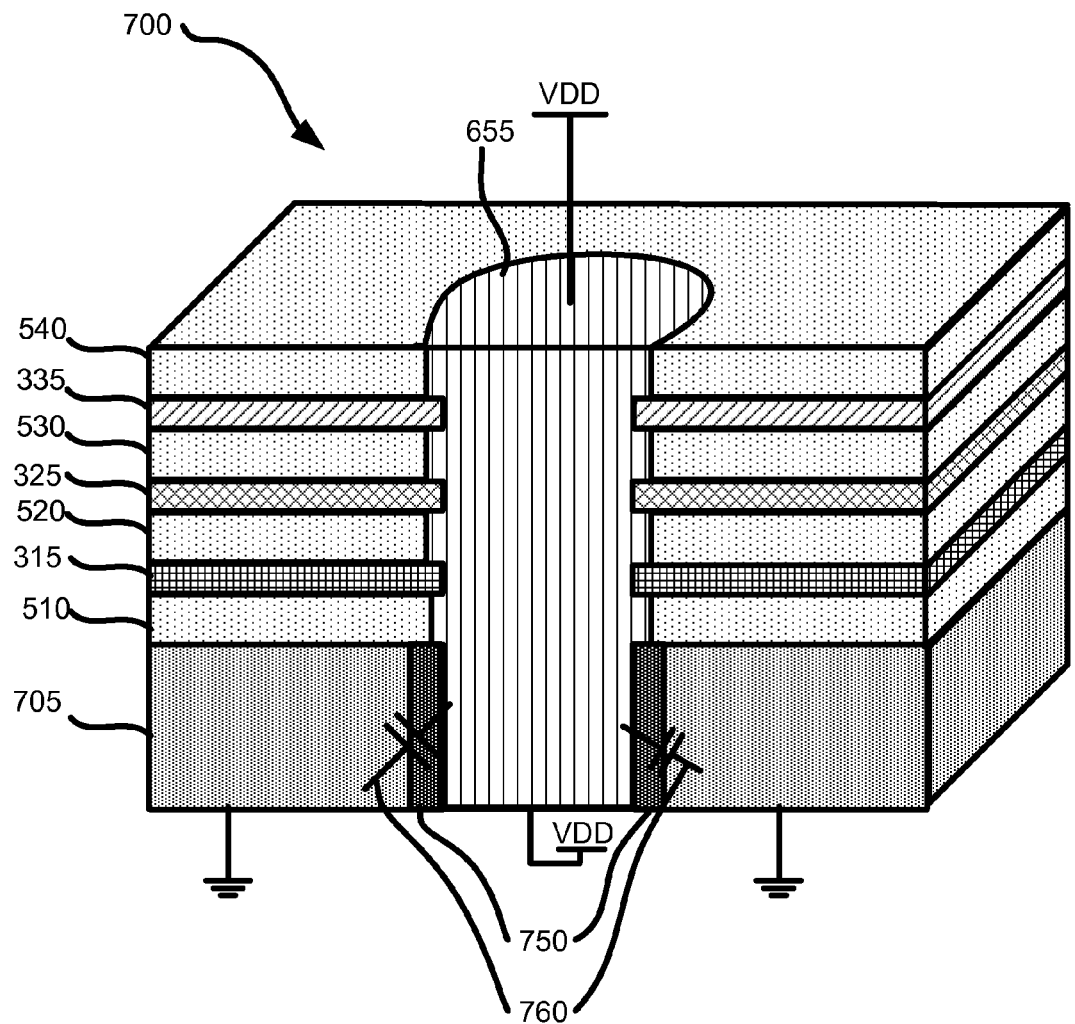
FIG. 8 is a perspective view of the second semiconductor structure of FIG. 7 according to an aspect of the invention.
Figure 9:
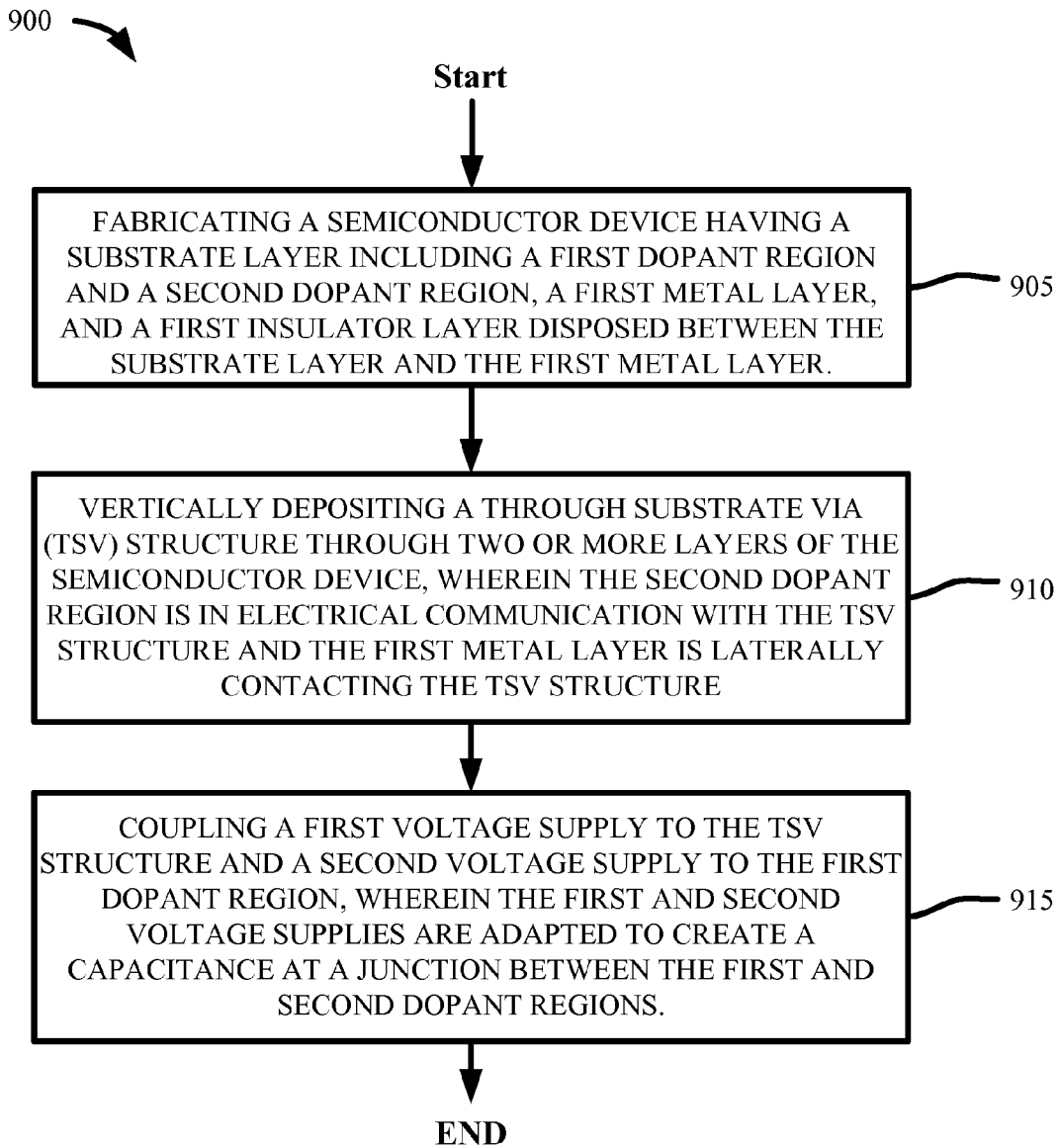
FIG. 9 illustrates a flowchart of a method according to an aspect of the invention.

Referring to FIG. 8, according to an aspect of the invention, a perspective, cross-sectional view of the semiconductor device 700 of FIG. 7 is shown. The semiconductor device 700 may include the TSV structure 655 extending vertically through two or more layers of the semiconductor device 700. The TSV structure 655 may be coupled to a first voltage supply. The semiconductor device 700 may also include the substrate layer including a first dopant region 705 and the second dopant region 750. The first dopant region 705 may be coupled to the second voltage supply. The second dopant region 750 may be in electrical communication with the TSV structure 655. The semiconductor device 700 may include at least first metal layer 315 and a first insulator layer 510 disposed between the substrate layer and the first metal layer 315. Additional metal layers and insulator layers disposed between the metal layers may also exist. The first metal layer 315 may laterally contact the TSV structure 655. The first voltage supply and the second voltage supply are adapted to create a capacitance at a junction between the first dopant region 705 and the second dopant region 750;

In another aspect of the invention, FIG. 9 is a block diagram of a method 900 for making a semiconductor device 700 with reduced resistance and decoupling capacitance utilizing a TSV. In operation 905, a semiconductor device may be formed having a substrate layer with a first dopant region (P-type) and a second dopant region (N-type). The semiconductor device also may include a first metal layer and a first insulator layer disposed between the substrate layer and the first metal layer. In operation 910, the TSV structure 655 may be formed by vertically depositing the TSV through two or more layers of the semiconductor device. The second dopant region may be in electrical communication with the TSV structure. Furthermore, the first metal layer may be laterally contacting the TSV structure 655. In operation 915, a first voltage supply (Vdd) may be coupled to the TSV structure. A second voltage supply (ground) may be coupled to the first dopant region. The first and second voltage supplies are adapted to create a capacitance at a junction between the first and second dopant regions.

While the invention has been described with reference to the specific aspects thereof, those skilled in the art will be able to make various modifications to the described aspects of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

What is claimed is:

1. A semiconductor device comprising:
a substrate layer including a first dopant region having a P− dopant type and further including a second dopant region having an N+ dopant type having a concentration of at least $10^{20}/cm^3$;
a first metal layer disposed above the substrate layer;
a first insulator layer disposed between the substrate layer and the first metal layer, a lower surface of the first insulator layer adjacent to and in physical contact with an upper surface of the substrate layer, an upper surface of the first insulator layer adjacent to and in physical contact with a lower surface of the first metal layer;
a conductive structure extending vertically through the first metal layer, the first insulator layer, and the substrate layer, the conductive structure further extending into the second dopant region, wherein a first diameter of the conductive structure in a plane of the first metal layer is smaller than a second diameter of the conductive structure in a plane of the first insulator layer, wherein the second dopant region abuts the conductive structure, wherein the second dopant region separates the conductive structure from the first dopant region, and wherein the first metal layer is in electrical contact with the conductive structure;
a first voltage supply with a first voltage coupled to the conductive structure; and
a second voltage supply, with a second voltage less than the first voltage, electrically coupled to the first dopant region, wherein the first and second voltage supplies create a capacitance of a back biased diode junction at a depletion region between the first dopant region and the second dopant region, wherein the first dopant region acts as a first electrode, the second dopant region acts as a second electrode, and the depletion region acts as an insulator to create the capacitance.

2. The semiconductor device of claim 1, further comprising:
a second metal layer disposed above the first metal layer; and
a second insulator layer disposed between the first metal layer and the second metal layer, a lower surface of the second insulator layer adjacent to and in physical contact with an upper surface of the first metal layer, an upper surface of the second insulator layer adjacent to and in physical contact with a lower surface of the second metal layer, wherein the conductive structure further extends vertically through the second metal layer and the second insulator layer, wherein a third diameter of the conductive structure in a plane of the second metal layer is smaller than a fourth diameter of the conductive structure in a plane of the second insulator layer, and wherein the second metal layer is in electrical contact with the conductive structure.

3. The semiconductor device of claim 2, wherein the first and second insulator layers are etched back to expose more surface area of the first and second metal layers for longitudinal and lateral contact between the metal layers and the conductive structure.

4. The semiconductor device of claim 1, wherein the first voltage supply is a power supply.

5. The semiconductor device of claim 1, wherein the second voltage supply is ground.

6. The semiconductor device of claim 1, wherein the conductive structure is coupled to the first voltage supply on a frontside and a backside of the semiconductor device.

7. The semiconductor device of claim 1, wherein the second dopant region is laterally contacting the conductive structure.

8. The semiconductor device of claim 1, further comprising:
a third dopant region, in the substrate layer, having a P+ dopant type with a greater dopant concentration than the first dopant region, the third dopant region disposed between the first dopant region and the second dopant region, to create a capacitance of a back biased diode junction at a depletion region between the second and third dopant regions, wherein the third dopant region acts as a first electrode, the second dopant region acts as a second electrode, and the depletion region acts as an insulator to create the capacitance.

* * * * *